United States Patent [19]

Schmitt

[11] Patent Number: 4,701,615
[45] Date of Patent: Oct. 20, 1987

[54] MEASURING SCALE CODING SYSTEM FOR LENGTH OR ANGLE MEASURING INSTRUMENTS

[75] Inventor: Walter Schmitt, Traunreut, Fed. Rep. of Germany

[73] Assignee: Johannes Heidenhain GmbH, Traunreut, Fed. Rep. of Germany

[21] Appl. No.: 755,928

[22] Filed: Jul. 17, 1985

[30] Foreign Application Priority Data

Jul. 25, 1984 [DE] Fed. Rep. of Germany ....... 3427411

[51] Int. Cl.$^4$ .............................................. G01D 5/34
[52] U.S. Cl. ............................. 250/237 G; 33/125 C; 340/347 P
[58] Field of Search .................... 250/237 G, 231 SE; 33/125 A, 125 C; 356/373, 374, 375, 395; 340/347 P

[56] References Cited

U.S. PATENT DOCUMENTS

| | | | |
|---|---|---|---|
| 3,982,106 | 9/1976 | Stutz | 250/237 G |
| 4,074,258 | 2/1978 | Dore et al. | 340/347 P |
| 4,403,859 | 9/1983 | Ernst | 356/374 |
| 4,412,745 | 11/1983 | Ohtomo et al. | 356/373 |
| 4,491,928 | 1/1985 | Reichl | 250/237 G |
| 4,519,140 | 5/1985 | Schmitt | 33/125 C |
| 4,602,242 | 7/1986 | Kimura | 250/237 G |

FOREIGN PATENT DOCUMENTS

| | | |
|---|---|---|
| 2416212 | 11/1974 | Fed. Rep. of Germany . |
| 2952106C2 | 4/1982 | Fed. Rep. of Germany . |
| 3039483A1 | 4/1982 | Fed. Rep. of Germany . |
| 3144334A1 | 5/1983 | Fed. Rep. of Germany . |

*Primary Examiner*—Edward P. Westin
*Attorney, Agent, or Firm*—Willian Brinks Olds Hofer Gilson & Lione Ltd.

[57] ABSTRACT

A system for distinguishing identical reference marks located on a graduation used in an instrument for measuring the relative position of two objects. An individual code mark, comprised of multiple code mark elements, is allocated to each reference mark. Each code mark element can occupy one of two possible locations. A binary number associated with each code mark is obtained during scanning of the reference marks and code mark elements. The binary number is generated from a stored raster by a decoding unit and is dependent upon the position of each code mark element, the spacing between adjacent code mark elements and the spacing between the reference mark and an adjacent code mark element.

15 Claims, 4 Drawing Figures

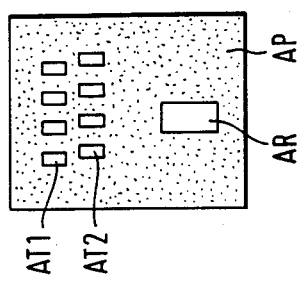
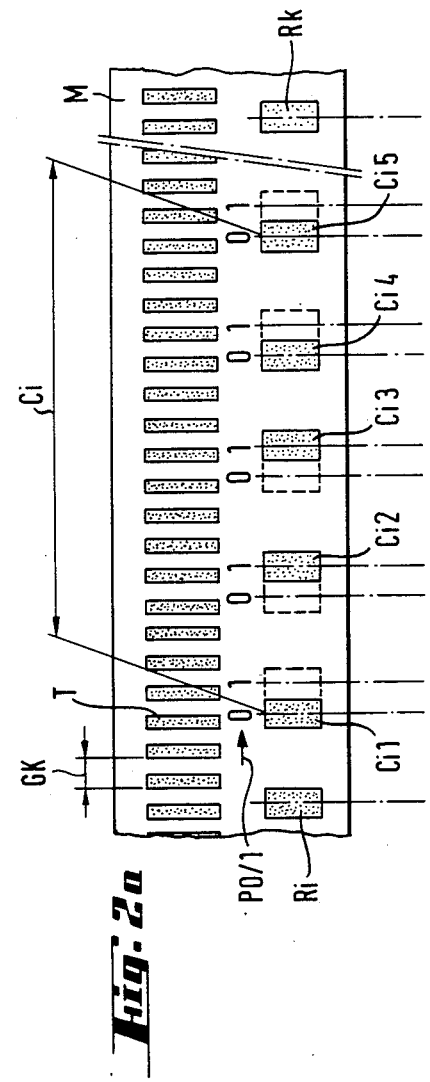
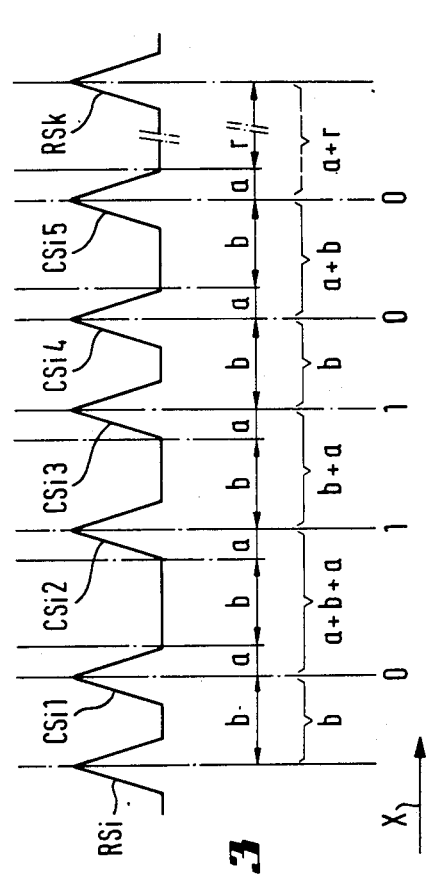

MEASURING SCALE CODING SYSTEM FOR LENGTH OR ANGLE MEASURING INSTRUMENTS

BACKGROUND OF THE INVENTION

The present invention relates to a system for measuring the relative position of two objects by using individual code marks, each consisting of several code mark elements, to absolutely identify individual reference marks provided along the graduation of a measuring scale.

Length or angle measuring instruments are used to measure the relative position of two movable objects. One type of such instrumentation includes a scale comprising an incremental graduation attached to the first object and a scanning device, capable of reading the scale, attached to the second object. Such measuring instruments are frequently used on machine tools to measure the relative position of the slide unit with respect to the machine bed.

U.S. Pat. No. 3,982,106 discloses a length or angle measuring system in which reference marks are provided on a separate track beside the incremental graduation marks. The absolute values of these reference marks are determined from the different spacings between the individual reference marks. These spacings are determined by scanning the incremental graduation. Two reference marks must be scanned to determine the absolute position of any given reference mark. This process can be complicated and time consuming if the two desired reference marks lie far apart. Moreover, if an error occurs in counting the increments between two reference marks, the determination of the spacing between the reference marks will be incorrect. This may result in a false determination of the absolute value for the reference mark.

U.S. Pat. No. 4,403,859 discloses an incremental length or angle measuring arrangement in which reference marks, with different line group distributions, are provided on a scale beside the graduation marks. The individual reference marks are aligned to be scanned by respective scanning fields of a scanning unit, and each scanning field is unambiguously allocated to a respective reference mark. This arrangement is relatively complicated since, in order to clearly identify the individual reference marks, the line group distributions must differ as strongly as possible from one another. Furthermore, an identical scanning field of the scanning unit is required for each reference mark.

U.S. Pat. No. 4,519,140 discloses an incremental length or angle measuring arrangement in which identical reference marks are provided on a separate track beside the incremental graduation. In order to identify the identical reference marks, a serial code mark on a separate track is allocated for each reference mark. These code marks consist in each case of code mark elements which represent a particular binary state. The other binary state is represented by the absence of code mark elements, i.e. gaps. The entire code mark, in the form of code mark elements and gaps, is serially scanned to obtain the sequence of binary states. This sequence yields the entire code information for the identification of the associated reference mark.

In such measuring systems the absolute values of the reference marks are generally referenced to the graduation zero point of the incremental graduation of the scale. Since the spacing of the reference marks with respect to one another is known, the reference marks can be used for checking the accuracy of the graduation increment count. However, in order to check the accuracy of the graduation increment count between the reference marks the code mark elements must be used. These elements are serially allocated to the individual reference marks and lie between the reference marks. The absence and presence of the code mark elements represent the binary state of the code mark. The binary representation of some code marks may result in the absence of several adjacent code mark elements, i.e. gaps. These gaps may present a difficulty if they are relatively large, since without code mark elements or reference marks it is not possible to check the accuracy of the graduation increment count.

SUMMARY OF THE INVENTION

It is an object of the present invention to reduce or eliminate these large gap areas so that a checking of the accuracy of the graduation increment count, in the zone of the code marks, can be performed.

This invention is directed to a system for measuring the relative position of two objects by using individual code marks to absolutely identify individual reference marks. According to this invention, code marks are provided which comprise a plurality of code mark elements, each element capable of occupying one of at least two possible positions. Each code mark is associated with a respective individual reference mark located on the measuring scale. From the position of the code mark elements, a binary number is obtained that corresponds to the associated code mark. A decoding unit, electrically connected to the scanning unit, processes the scanning signals and produces the binary number.

An advantage of the present invention is that the arrangement of the code mark elements between the reference marks allows for a simple, constant, virtually gap-free checking of the measuring accuracy of the system. Therefore, the present measuring system can be installed on devices such as machine tools to improve their measuring and operating accuracy.

Additionally, the electric control signals generated from the reference marks can be utilized in various ways, such as reproducing the zero position, locating a particular position for the start of a measurement, checking of interference signals and for use in a control system.

BRIEF DESCRIPTION OF THE DRAWINGS

FIG. 2a is a top view of a measuring scale included in the embodiment of FIG. 1.

FIG. 2b is a top view of a scanning plate included in the embodiment of FIG. 1.

FIG. 3 is a signal diagram of reference signals and code signals generated by the embodiment of FIG. 1.

DETAILED DESCRIPTION OF THE PREFERRED EMBODIMENT

Figure 1:
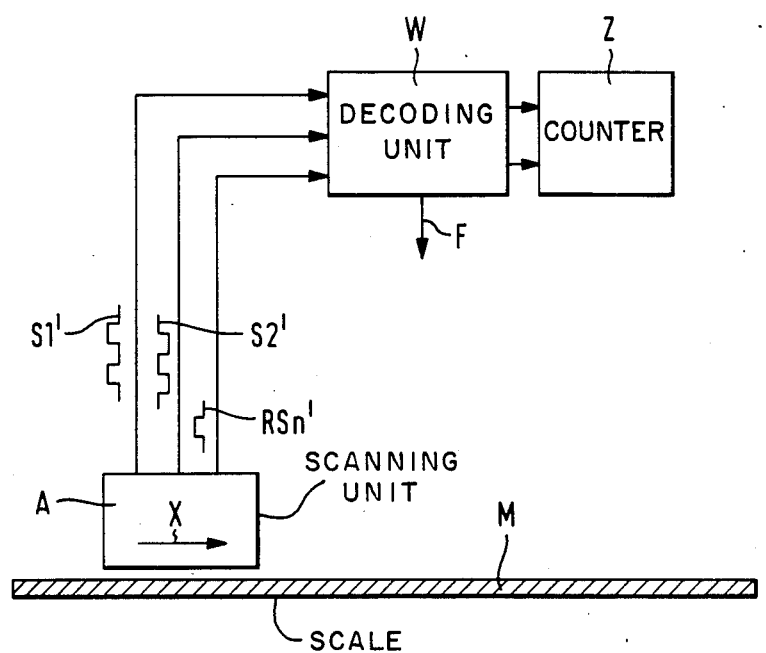
FIG. 1 is a schematic representation of an incremental length measuring arrangement which incorporates a presently preferred embodiment of this invention.

Turning now to the drawings, FIG. 1 schematically shows a photoelectric incremental length measuring system which includes a measurement embodiment in the form of a scale M and a scanning unit A. The system may be installed on a device such as a machine tool (not shown). An incremental graduation T in the form of a line grid (FIG. 2a) is located on the scale M. The incremental graduation T is photoelectrically scanned, without contact, in direct light by the scanning unit A. A series of identical reference marks, $R_n$ (n=1,2,3, ...), are located on the scale M alongside the graduation T at respective positions along the measuring direction X. These identical reference marks $R_n$ present identical line groups with a predetermined but irregular line distribution and are absolutely positioned with respect to the graduation T. For illustration purposes only, two adjacent reference marks, $R_i$ and $R_k$, are shown in FIG. 2a and are represented as simple rectangular regions.

The periodic scanning signals generated by the scanning of the graduation T are amplified in the scanning unit A and transformed into square signals $S_1'$ and $S_2'$. Signals $S_1'$ and $S_2'$ are processed by a decoding unit W and can be displayed in a counter Z as position values for the relative position of the objects to be measured. Scanning fields AT, arranged in two groups $AT_1$ and $AT_2$, are offset with respect to one another by a quarter of the grid constant GK so that the direction of movement of the scanning unit A along the graduation T can be determined. The offsetting of the two groups $AT_1$ and $AT_2$ results in the scanning signals being phase-shifted with respect to one another. This phase-shifting, using conventional processing, yields scanning direction information. The generation of the reference signals $RS_n$ occurs through a reference mark scanning field AR located on the scanning plate AP. Scanning of the reference marks $R_n$ generates reference signals $RS_n$ which are amplified in the scanning unit A and transformed into square wave signals $RS_n'$. Signals $RS_n'$ are then processed by the decoding unit W.

To provide for identification, each individual reference mark $R_n$ is serially allocated a code mark $C_n$ (n=1,2,3, ...). Reference mark $R_i$ is shown in FIG. 2a with its associated code mark $C_i$. Each code mark $C_i$ is made up of a set of code mark elements $C_{in}$. The code mark elements $C_{i1}$ to $C_{i5}$, in FIG. 2a, are configured identically with the pattern of reference marks $R_n$ and are scanned by the same reference mark scanning field AR. For ease of illustration, the code mark elements are also represented as rectangular regions.

Within each code mark $C_i$, each code mark element $C_{in}$ can occupy one of two possible positions $P_0$ or $P_1$. Which of the two possible positions $P_0$ or $P_1$ the particular code mark element $C_{in}$ occupies is determined by the information that the code mark $C_i$ is to represent. If code mark element $C_{in}$ occupies position $P_0$ a binary value of "0" is represented. If code mark element $C_{in}$ occupies the position $P_1$, then the binary value "1" is represented.

In the example shown in FIG. 2a, the entire code mark $C_i$ consists of five code mark elements; $C_{i1}$ occupies the position $P_0$, $C_{i2}$ occupies the position $P_1$, $C_{i3}$ occupies the position $P_1$, $C_{i4}$ occupies the position $P_0$, and $C_{i5}$ occupies the position $P_0$. From these positions the binary code 0-1-1-0-0 can be derived. This binary code represents the identification key for the code mark $C_i$.

The scanning plate AP comprises three scanning fields: two scanning fields $AT_1$ and $AT_2$ are used for scanning the graduation T, and one reference mark scanning field AR is used for scanning the reference marks $R_n$ and the code marks $C_n$. The photo-elements used for scanning the scanning plate AP are known and commonly used and therefore are not represented. Signals obtained from these scanning fields are processed by the decoding unit W.

During the scanning of the scale M in the positive measuring direction X (left to right), reference signal $RS_i$, code signals $CS_{i1}$ to $CS_{i5}$ and reference signal $RS_k$ are generated. These signals are schematically represented in FIG. 3. In order to determine the binary combination 0-1-1-0-0 of the code signals $CS_{i1}$ to $CS_{i5}$, a series of spacings a, b and r must be known. The distance between the two possible positions, $P_0$ and $P_1$, of each code mark element $C_{im}$ is represented as spacing a. The distance between adjacent code mark elements $C_{i1}$ and $C_{i2}$, $C_{i2}$ and $C_{i3}$, etc. is represented as spacing b. The residual distance between the last code mark element $C_{i5}$ and the following reference mark $R_k$ is represented by spacing r. The latter spacing, r, is recognized as soon as the distance processed is greater than the sum of the distances b+2a. The spacings a, b are established at the time of the production of the scale M and are stored as a spacing raster in a memory unit of the decoding unit W.

During the scanning of the reference marks $R_i$ and $R_k$ and of the code mark elements $C_{i1}$ to $C_{i5}$, the spacings a, b, r, lying between the reference marks $RS_i$ and the code signals $CS_{i1}$ to $CS_{i5}$, are measured with the aid of the graduation line count of the graduation T. The measured spacings a, b, r are then compared with the stored spacing raster of the decoding unit W to determine the binary code information of the individual code signals $CS_{i1}$ to $CS_{i5}$.

During the left and right scanning of the scale M in the measuring direction X, shown in FIGS. 2a and 3, reference mark signal $RS_i$ is first encountered. As the scanning continues in the X direction, the first code signal $CS_{i1}$ with the code information 0 is encountered at spacing b. The second code signal $CS_{i2}$ representing code information 1 is encountered at spacing a+b+a. The third code signal $CS_{i3}$ with the code information 1 is encountered at the further distance of b+a. The fourth code signal $CS_{i4}$ with code information 0 is encountered at the further distance b. The fifth code signal $CS_{i5}$ with the code information 0 is located at the further distance a+b. And finally, the reference signal $RS_k$ is encountered at the further distance a+r.

If the scanning unit A continues to scan the scale M further in the positive measuring direction X, the next code mark $C_k$ with code mark elements $C_{km}$ would be encountered after reference mark $R_k$. The code mark $C_k$ would then be followed by the next reference mark, $R_{k+1}$.

When scanning in the positive measuring direction, X (left to right), scanning of the code information data of code mark elements $C_{nm}$ occurs after the scanning of the associated reference mark $R_n$. When scanning in the negative measuring direction, minus X (right to left), the code mark elements $C_{im}$ will be in reverse order and will be encountered before the scanning of the associated reference mark $R_i$.

The code mark elements $C_{nm}$ and the reference marks $R_n$ are formed as whole-number multiples of the grid constant GK of the incremental graduation T. This allows the scanning of the code mark elements $C_{nm}$ and the reference marks $R_n$ to occur at the same frequency as the scanning of the incremental graduation T. Additionally, the spacings a,b,r are preferably whole-number multiples of the graduation T.

The processing of the generated code signals $CS_{nm}$ as well as the comparison of the measured spacings a,b,r with the spacings stored in the spacing raster occurs in the decoding unit W. The decoding unit W can also provide a selection system in which predetermined reference marks $R_n$ can be selected.

The serial arrangement of the code mark elements $C_{nm}$ of the code marks $C_n$ between the reference marks $R_n$, of the present invention, permits a steady, virtually gap-free, checking of the accuracy of the graduation increment count of the graduation T. This is possible because no relatively large gaps can arise between the individual code mark elements $C_{nm}$. In the illustrated embodiment the coded information must be located in one of two possible positions $P_0$, $P_1$ for each code mark element $C_{nm}$. Each reference signal $RS_n$ and each code signal $CS_{nm}$ generated can be used by the decoding unit W to determine the position of the corresponding reference mark $R_n$ and of the corresponding code mark element $C_{nm}$. Since the positions of the reference marks $R_n$ are absolutely allocated to the graduation T and the positions of the individual code mark elements $C_{nm}$ are prescribed by the spacings a,b,r stored in the spacing raster, the graduation increment count of the graduation T can be checked for accuracy. If a difference arises between the count and the spacing raster, an error signal F is generated by the decoding unit W, indicating an erroneous measurement has been detected.

Nonvolatile memory, ROM or PROM, can be used in the decoding unit W for storing the spacing raster. Adaptation of the decoding unit W to specific spacing rasters of different scale types can occur by reprogramming the decoding unit's memory. If the decoding unit W has a large memory capacity, spacing rasters for several different scales can be stored. The particular spacing raster for the scale to be used can then be selected by the associated spacing r of the spacing raster.

Additionally, the reference signals $RS_n$ obtained from the reference marks $R_n$ can be used in various functions. Since each reference mark $R_n$ is allocated a number which characterizes its absolute position with respect to the graduation zero point of the graduation T, a semi-absolute measuring system is generated from an incremental system. Furthermore, a particular reference mark $R_o$ (not shown) can serve to initialize the counter Z when the reference signal $RS_o$ is processed.

An additional function is to use the code marks $C_n$ to represent the starting point and ending point of an information block. On encountering the start of block signal, the decoding unit W can be programmed such that code information following the start signal, will be read. Upon encountering the end of block signal, decoding unit W is assured that the entire code information has been read. In this way a reversal of the scanning direction in the middle of the scanning of the code information data can be recognized.

Additional spacings, other than the described spacings a,b,r, can also be used as identification spacings—preferably between code mark elements. By using these additional identification spacings the decoding can be synchronized. For example, the decoding of the code mark element signals can be started after the next additional spacing. This allows the travel paths of the scanning unit A to be shortened since it is not necessary to seek the spacing r and scan past it. The synchronization occurs by the next encountered spacing, be it r or one of the additional spacings.

Of course, it should be understood that a wide range of changes and modifications can be made to the preferred embodiments described above. For example, this invention is not restricted to use with photoelectric measuring instruments, but can readily be adapted for use with other types of measuring instruments. It is therefore intended that the foregoing detailed description be regarded as illustrative rather than limiting, and that it be understood that it is the following claims, including all equivalents, which are intended to define the scope of this invention.

I claim:

1. In a measuring instrument for measuring the relative position of two objects, of the type comprising a measuring scale extending along a measuring direction and defining a measuring graduation, a plurality of identical reference marks absolutely allocated to the graduation, a plurality of individual code marks each comprising several code mark elements for identification of the respective reference marks, a scanning unit positioned to scan the graduation, the reference marks and the code marks, and a decoding unit electrically connected to the scanning unit, the improvement comprising:

two scanning positions for each code mark element, each code mark element occupying only one of said scanning positions;

a scanning position raster comprising means for storing information indicative of the location of each occupied scanning position of each code mark element, said raster electrically connected to said decoding unit; and means for generating a binary number in response to each code mark based upon the occupied scanning positions of each code mark element, said scanning unit, scanning positions, raster, identifying means and decoding unit cooperating to produce a unique identifying number for each code mark.

2. The invention of claim 1 wherein said raster comprises a stored set of spacings, and wherein said set comprises spacings between the two scanning positions of each code mark element, spacings between adjacent code mark elements, and spacings between the reference mark and the adjacent code mark element.

3. The invention of claim 1 wherein the improvement further comprises:

a scanning plate comprising a common scanning field; and a photo-detector allocated to the common scanning field, the photo-detector and scanning plate operative to serially scan the reference marks and the code mark elements.

4. The invention of claim 1 wherein the graduation is comprised of increments, the improvement further comprising:

means for producing a count of the graduation increments; and means for comparing the count with the binary representation of each code mark.

5. The invention of claim 2 wherein the graduation is comprised of increments, the improvement comprising:

means for producing a count of the graduation increments; and means for comparing the count with the stored set of spacings.

6. The invention of claim 4 wherein the comparing means comprises means for generating an error signal in response to an unequal comparison.

7. The invention of claim 5 wherein the comparing means comprises means for generating an error signal in response to an unequal comparison.

8. The invention of claim 1 wherein selected ones of the code mark elements represent an end of block signal.

9. The invention of claim 1 wherein the graduation comprises an array of line grids separated by a constant spacing in the measuring direction, and wherein the improvement further comprises said code mark elements and said reference marks constructed as whole-number parts of the grid constant.

10. The invention of claim 1 wherein the graduation comprises an array of line grids separated by a constant spacing in the measuring direction, and wherein the improvement further comprises said code mark elements and said reference marks constructed as whole-number multiples of the grid constant.

11. The invention of claim 2 wherein the graduation comprises grids at constant spacing in the measuring direction, the improvement further comprising spacings of said raster formed as whole-number parts of the grid constant.

12. The invention of claim 2 wherein the graduation comprises grids at constant spacing in the measuring direction, the improvement further comprising spacings of said raster formed as whole-number multiples of the grid constant.

13. The invention of claim 2 wherein the improvement further comprises:
means for storing a plurality of sets of spacings for a plurality of measuring scales; and
means for selecting a particular set of spacings based upon the spacing between the reference mark and the adjacent code mark element.

14. In a measuring instrument for measuring the relative position of two objects, the measuring instrument of the type comprising a measuring scale extending along a measuring direction and defining a measuring graduation; a plurality of identical reference marks absolutely allocated to the graduation; a plurality of individual code marks each comprising several code mark elements for identification of the respective reference marks; a scanning unit positioned to scan the graduation, the reference marks and the code marks; and a decoding unit electrically connected to the scanning unit, the improvement comprising:
means for defining the plurality of code mark elements such that each code mark element is positioned at a respective selected one of at least two unique distances relative to a reference position associated with the previous code mark element;
a scanning position raster comprising means for storing information indicative of the distance of each code mark element from the reference position, the raster electrically connected to said decoding unit; and
means for generating a numerical representation in response to each code mark based upon the positions of each code mark element;
the scanning unit, raster, identifying means and decoding unit cooperating to produce a unique identifying number for each code mark.

15. The invention of claim 14 wherein the improvement further comprises:
means for storing a plurality of sets of spacings for a plurality of measuring scales; and
means for selecting a particular set of spacings based upon the spacing between the reference mark and the adjacent code mark element.

* * * * *